United States Patent [19]

Takahashi

[11] Patent Number: 5,016,066

[45] Date of Patent: May 14, 1991

[54] VERTICAL POWER MOSFET HAVING HIGH WITHSTAND VOLTAGE AND HIGH SWITCHING SPEED

[75] Inventor: Mitsuasa Takahashi, Tokyo, Japan

[73] Assignee: NEC Corporation, Japan

[21] Appl. No.: 331,449

[22] Filed: Mar. 31, 1989

[30] Foreign Application Priority Data

Apr. 1, 1988 [JP] Japan .................................. 63-81490

[51] Int. Cl.$^5$ ..................... H01L 29/10; H01L 29/78; H01L 29/34
[52] U.S. Cl. .................... 357/23.4; 357/23.8; 357/23.12; 357/41; 357/52; 357/89
[58] Field of Search ................... 357/23.4, 23.8, 23.12, 357/23.14, 41, 52, 89

[56] References Cited

U.S. PATENT DOCUMENTS

| 4,376,286 | 3/1983 | Lidow et al. | 357/23.8 |
|---|---|---|---|
| 4,455,566 | 6/1984 | Sakurai | 357/23.4 |
| 4,593,302 | 6/1986 | Lidow et al. | 357/23.4 |

FOREIGN PATENT DOCUMENTS

| 61-64165 | 4/1986 | Japan | 357/23.4 |
|---|---|---|---|
| 61-168263 | 7/1986 | Japan | 357/23.8 |
| 62-176168 | 8/1987 | Japan | 357/23.4 |
| 63-133678 | 6/1988 | Japan | 357/23.4 |
| 1-42177 | 2/1989 | Japan | 357/23.4 |

Primary Examiner—Andrew J. James
Assistant Examiner—Ngan Van Ngo
Attorney, Agent, or Firm—Laff, Whitesel, Conte & Saret

[57] ABSTRACT

In a vertical field effect transistor including a source electrode and a gate on the front surface of a semiconductor substrate having one conductivity type and a drain electrode on the back surface of the substrate, the semiconductor device of the present invention has the structure wherein a connection region of one conductivity type positioned between two channel forming base regions of the opposite conductivity type is formed by a semiconductor layer having a higher impurity concentration than the drain region of the one conductivity type, and the surface portion of the connection region which is connected to the channel has a lower impurity concentration than the connection region.

13 Claims, 6 Drawing Sheets

VERTICAL POWER MOSFET HAVING HIGH WITHSTAND VOLTAGE AND HIGH SWITCHING SPEED

BACKGROUND OF THE INVENTION

1. Field of the Invention

The present invention relates to a vertical field effect transistor, and more particularly to a vertical field effect transistor having high power and high speed switching characteristics.

2. Description of the Related Art

Power source devices that have conventionally been used for general purposes or for industrial purposes have been made more and more compact in size and economical in cost by increasing a frequency as typified by switching regulators, and high output performance as well as high speed switching performance have been required for switching transistors used for such devices.

Generally, vertical field effect transistors (hereinafter referred to as "VMOSFETs") having the structure wherein a plurality of sources and gates are formed on the upper surface of a semiconductor substrate and connected in parallel with each other while a drain electrode is formed on the bottom surface. Current flows through the substrate in the thickness direction to provide a high power and a high switching speed The VMOSFETs have been used as the switching transistors of the kind described above.

However, since the VMOSFETs of this kind have a large on-resistance, a high power switching current can be hardly obtained, and various proposals for improving the drawback have been made in order to attain higher power switching by obtaining a small on-resistance.

Figure 1:
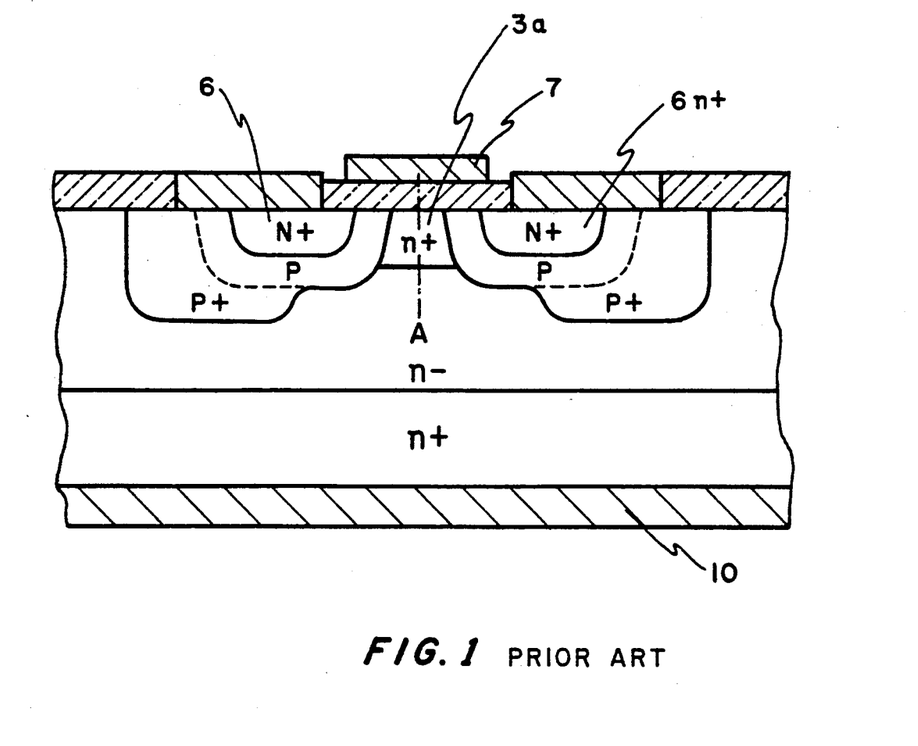
FIG. 1 is a sectional view of a semiconductor chip showing the VMOSFET of the first conventional example.

FIG. 1 is a sectional view of a semiconductor chip having VMOSFETs as the first conventional example. This was disclosed in Japanese Patent Laid-Open No. 52-106688 A high impurity concentration n+ connection region 3a is formed between two n+ source regions 6 and below an oxide film of a gate electrode 7 so as to eliminate degradation of frequency characteristics by reducing an internal resistance and thus to improve transconductance. Incidentally, a drain electrode 10 is formed on the back of the substrate.

Figure 2:
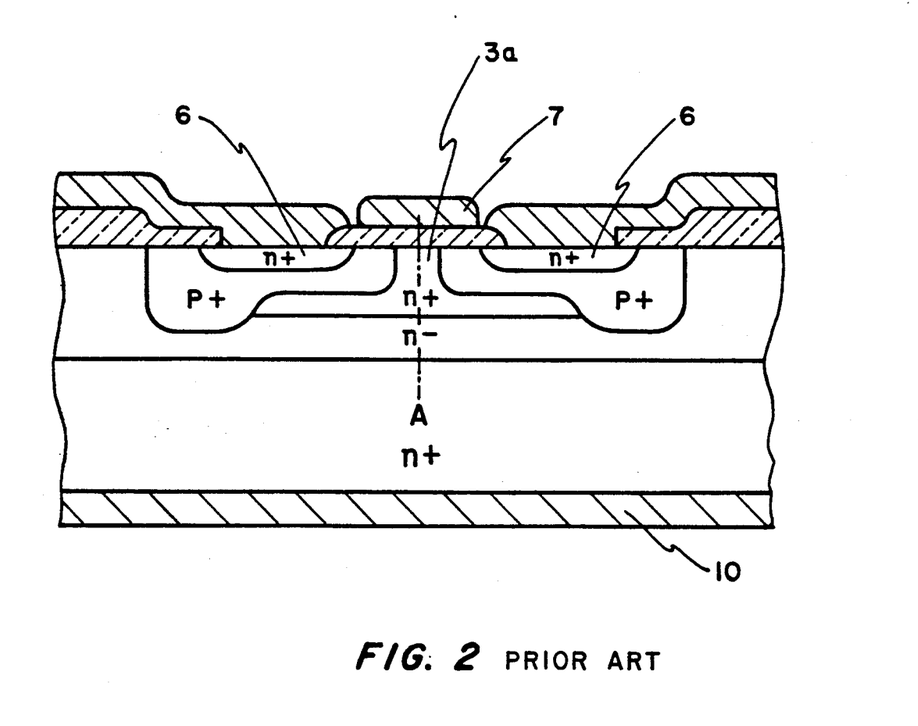
FIG. 2 is a sectional view of a semiconductor chip showing the VMOSFET of the second conventional example.
Figure 3A:
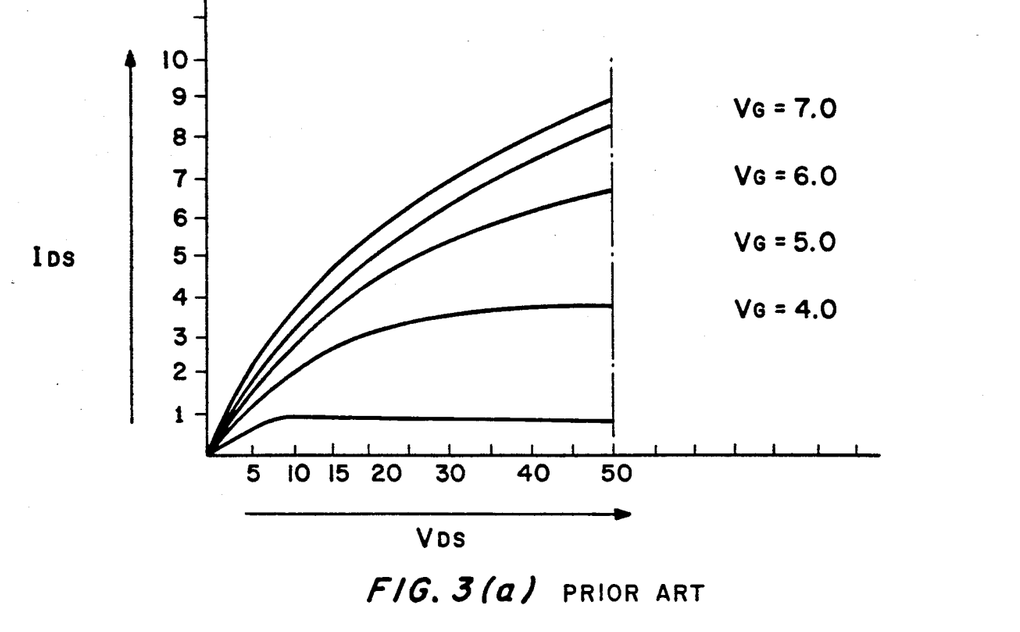
FIGS. 3(a) and 3(b) are diagrams of the drain current characteristics before and after improvement in the second conventional example by changing the gate voltage $V_G$ of VMOSFET, respectively.
Figure 3B:
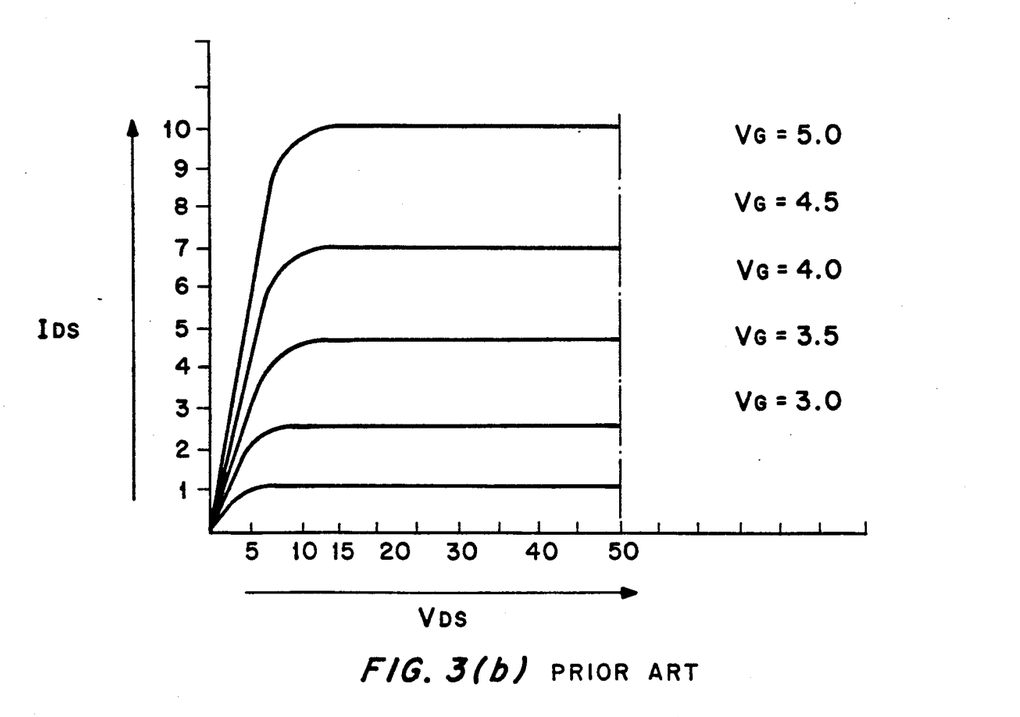

FIG. 2 is a sectional view of a semiconductor chip and shows the second conventional example. FIGS. 3(a) and 3(b) are diagrams of drain current characteristics before and after the improvement by this second conventional example, respectively, when the gate voltage $V_G$ of VMOSFET is changed This VMOSFET was proposed in U.S. Pat. No. 4,376,286 and U.S. Pat. No. 4,593,302. In the same way as in the first conventional example described above, a high impurity concentration n+ source region 3a is formed below the gate electrode 7 and between the n source regions 6 in order to reduce on-resistance The improvement is attained from the diagram shown in FIG. 3(a) to the diagram shown in FIG. 3(b).

Figure 9:
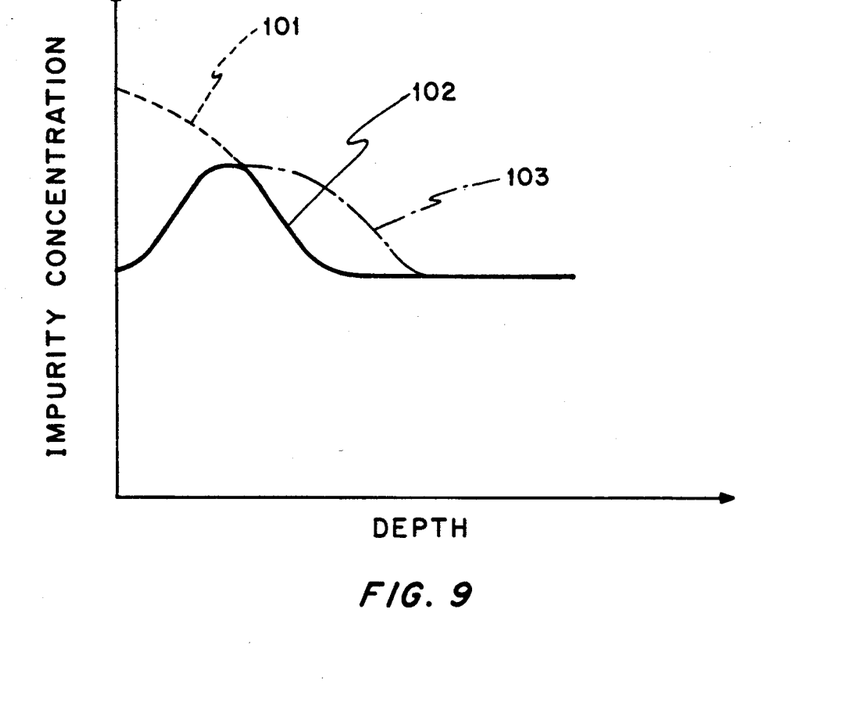
FIG. 9 is a diagram showing the concentration distribution of a connection region in a vertical direction A of first and second conventional examples shown in FIGS. 1 and 2 and first and second embodiments of the present invention shown in FIGS. 5 and 8.

The broken line 101 in FIG. 9 represents the distribution of the impurity concentration in the n+ connection region 3a in the longitudinal direction A in the first and second conventional examples shown in FIG. 1 and FIG. 2. As shown in the diagram, the concentration is the highest near the surface of the semiconductor substrate and becomes lower with an increase in depth. In this manner on-resistance is reduced.

In the conventional VMOSFETs described above, since the impurity concentration of the n+ connection region 3a below the gate oxide film is the highest on the surface of the semiconductor substrate and becomes lower with an increase in depth, on-resistance becomes small and high power switching can be achieved. However, the following problems occur because the impurity concentration of the connection region 3a near the surface is the highest.

Figure 4:
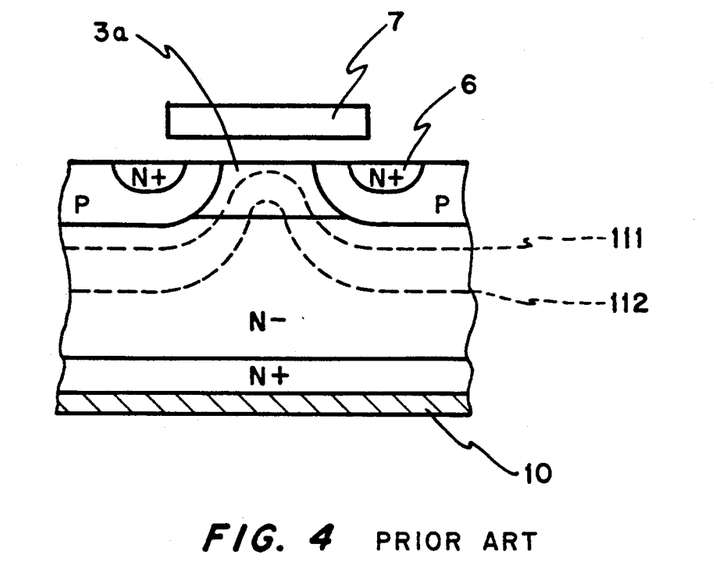
FIG. 4 is a schematic sectional view of a semiconductor chip showing the formation state of a depletion layer in the conventional example.

FIG. 4 is a schematic sectional view of a semiconductor chip and shows the formation state of a depletion layer in the conventional example When a bias voltage is applied to the drain electrode 10, there occurs the problem in which the depletion layer 111 changes to a depletion layer 112 and curves more sharply towards the gate 7 as the applied voltage becomes larger, and the field strength becomes larger, thereby causing degradation of the withstand voltage. Moreover, since the depletion layer cannot spread and becomes narrow, a parasitic capacitance also becomes large to lower the switching speed.

SUMMARY OF THE INVENTION

It is, therefore an object of the present invention to provide a high power VMOSFET capable of high speed switching.

In a vertical field effect transistor including a source electrode and a gate on the upper surface of a semiconductor substrate of one conductivity type and a drain electrode on the bottom surface of the substrate, the vertical field effect transistor of the present invention has the structure wherein a connection region of one conductivity type is formed between two base regions of the other conductivity type in which a channel is formed, the connection region being formed by a semiconductor layer having a higher concentration than a low concentration drain region of one conductivity type and the surface portion of the connection region connected to the channel has an impurity concentration lower than that of the connection region.

In the VMOSFET of the present invention, since the impurity concentration of the surface portion of the connection region is lowered, the depletion layer is likely to be extended when the bias voltage is applied to the drain. Therefore, the withstand voltage becomes higher and the parasitic capacitance becomes lower.

Moreover, since the surface portion of the connection region is turned into the accumulation layer by the application of the bias voltage to the gate, the resistance characteristics at the time of conduction do not change from that in the prior art devices in which the impurity concentration of the surface portion of the connection remains high.

According to the present invention, therefore, high power VMOSFET having high speed switching performance achieved by reducing the parasitic capacitance and high power switching performance achieved by lowering the on-resistance can be obtained.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 5:
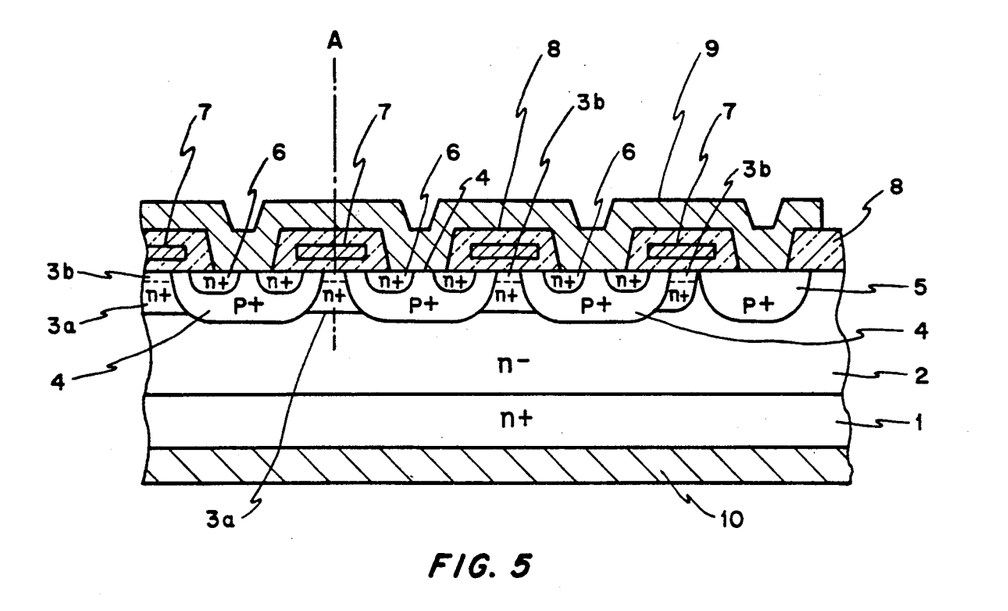
FIG. 5 is a sectional view of a semiconductor chip showing a first embodiment of the present invention.

FIG. 5 is a sectional view of a semiconductor chip showing the first embodiment of the present invention. This embodiment represents the case of an n-channel. In order to attain a withstand voltage of at least 500V, a 45 μm-thick and P (phosphorus)-doped n⁻-conductivity type drain region 2 having a resistivity of 18 ohm-cm and an impurity concentration of $2.7 \times 10^{14}/cm^3$ is formed by epitaxial growth on a high concentration n⁺ semiconductor substrate 1 which is Sb-doped and has resistivity of from 0.008 to 0.015 ohm-cm, an impurity concentration of $2 \times 10^{18}/cm^3$ and a thickness of 440 μm. Phosphorus (P) as an n-type impurity is ion-implanted at an acceleration energy of 120 keV and in a dose of $1.5 \times 10^{12}$ cm², for example, and drive-in diffusion is carried out at 1,200° C. for 240 minutes, for example, to form an n⁺ connection region 3a having a depth of 3.8 μm, at which the impurity concentration is twice as that of the n⁻ drain region 2, and a peak impurity concentration of the impurity of $1.2 \times 10^{15}/cm^3$. Next, Boron (B) ions as the p-type impurity are implanted at an acceleration voltage of 70 keV and in a dose of $3 \times 10^{11}$ cm², for example, so as to reduce the n type impurity concentration of the surface portion of the n⁺ connection region 3a to form an n⁻ connection region 3b which is 0.5 μm deep and has a concentration almost equal to that of the n⁻ conductivity type drain region 2.

The following members from a p⁺ base region 4 to a drain electrode 10 are formed by a known method. For example, an oxide film is first formed and a window is selectively opened by photolithography. Then, a p⁺ well 5 is formed by ion implantation. After the oxide film is removed, an insulator film 8 below the gate electrode 7 is grown, and a 6,000 Å-thick polycrystalline silicon layer in which phosphorus is doped at about $10^{20}/cm^3$ is grown on the insulator film 8, thereby forming the gate electrode 7. Next, a p⁺ base region 4 and an n⁺ source region 6 are formed by an ion implantation method. Then another oxide film 8 is grown on the gate electrode 7 by a CVD method so as to insulate it. Thereafter, a source electrode 9 and a drain electrode 10 are formed by metal evaporation and dry etching.

The surface impurity concentration of the P⁺ base region 4 is $1 \times 10^{18} cm^3$ and the junction depth thereof is about 4.3 μm. This base region 4 is formed by implanting the B ions at an acceleration energy of 70 keV and in a dose of $1 \times 10^{14}$ cm² and diffusing them at 1,200° C. for 60 minutes in an $N_2$ atmosphere. The surface concentration of the n⁺ source region 6 is $2 \times 10^{20}/cm^3$ and the junction depth thereof is 0.9 μm. This source region is formed by implanting phosphorus ions at an acceleration energy of 80 keV and in a dose of $5 \times 10^{15}/cm^2$ and diffusing them at 1,000° C. for 30 minutes in an $N_2$ atmosphere. Aluminum of 3.5 μm thickness is used for the source electrode 9 while Ag is used for the drain electrode 10.

Figure 6:
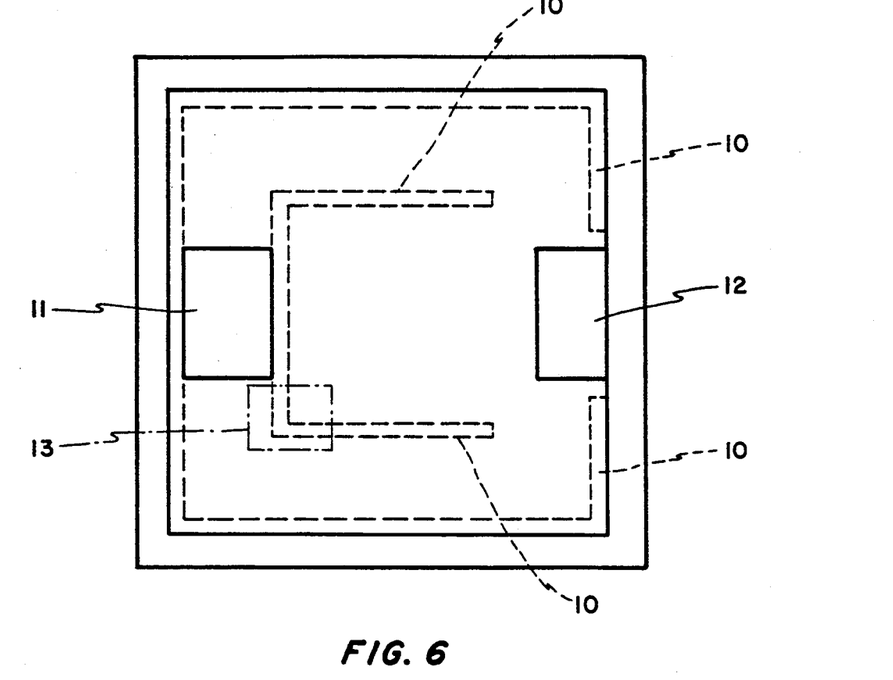
FIG. 6 is a plan view of a semiconductor chip for explaining the MOSFET of the first embodiment of the present invention.

FIG. 6 is a plan view of the thus formed VMOSFET. A source pad 12 connecting in parallel a plurality of source regions and a gate pad 11 for applying a control voltage to the gate is formed on the surface of VMOSFET. A plurality of gate fingers 10 are connected to the gate pad 11. Each gate finger is insulated from the source electrode 9 by an interlayer insulator film (not shown) and connected to the gate electrode 7 by a plurality of contact holes through the interlayer insulator film.

Figure 7:
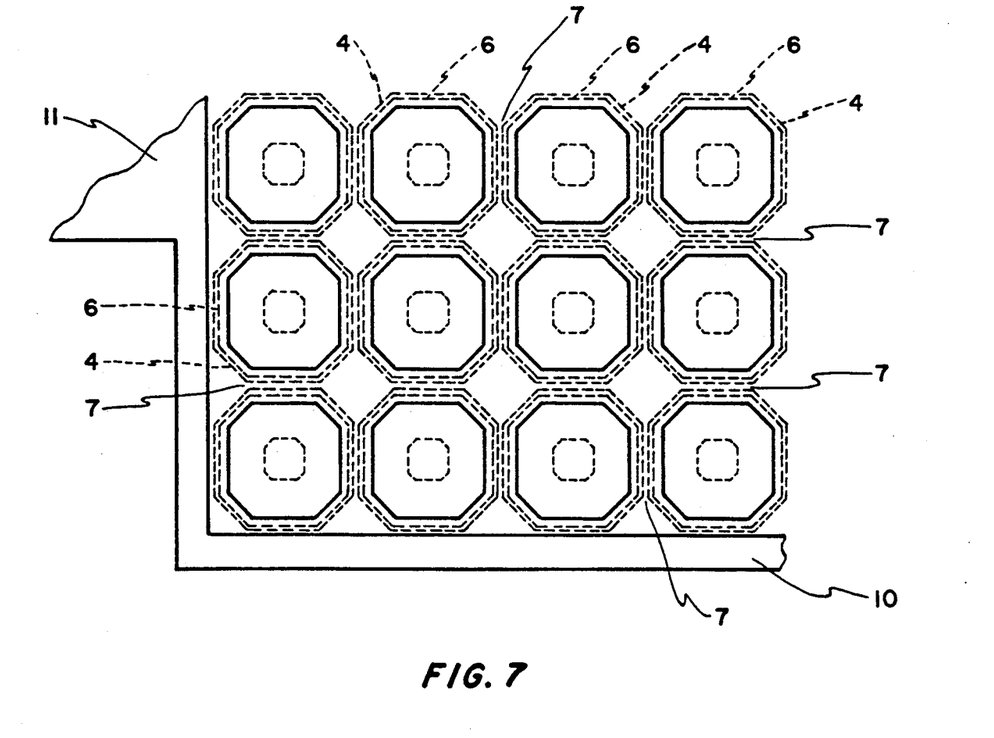
FIG. 7 is a plan view showing expanded gate electrodes and source regions of portion 13 in FIG. 6.

FIG. 7 is a plan view showing the gate electrode and the source region when the portion 13 of FIG. 6 is enlarged. The portions represented by broken lines are the source regions 6 and an inequilateral octagonal shape is formed by slightly cutting off each corner of the conventional square source region. The base region 4 also has the same shape as the source region 6. This octagonal shape is adopted to avoid the concentration drop at the corners and to relax the concentration of the field strength, resulting in preventing the occurrence of punch-through. Since both the source region 6 and the base region 4 have the inequilateral octagonal shape, the channel width can be made greater than that of the source region of the hexagonal shape proposed in the second conventional example, resulting in that a larger current can flow between source and drain regions. Solid line represents each gate electrode 7. The gate electrodes 7 are arranged in the lattice-like form and connected at a plurality of positions to the gate fingers 10 so as to prevent the occurrence of the voltage drop due to connection resistance or the like, as described above.

Figure 8:
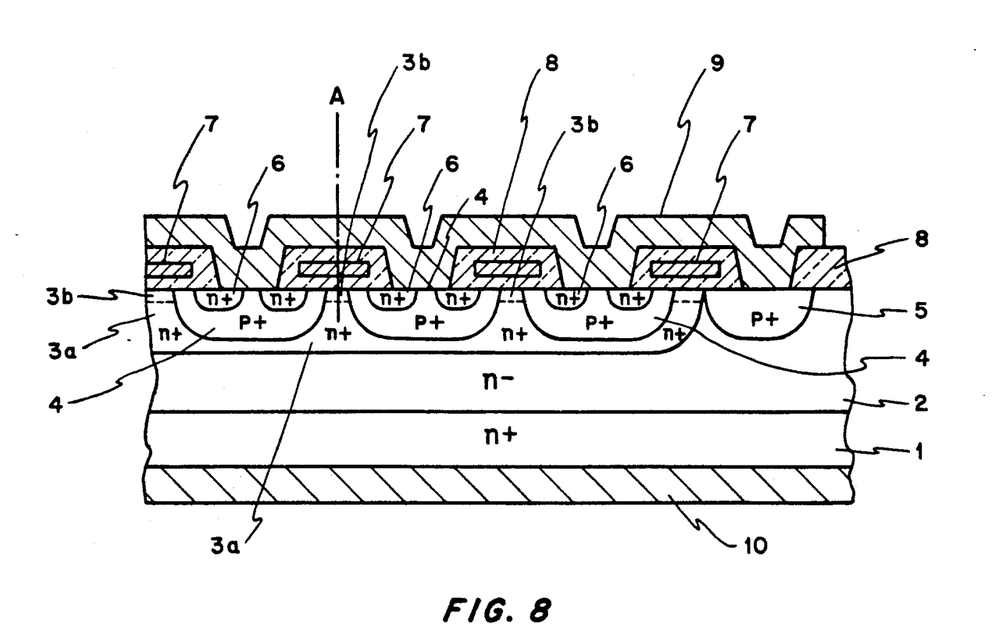
FIG. 8 is a sectional view of a semiconductor chip showing a second embodiment of the present invention.

FIG. 8 is a sectional view of the semiconductor chip showing the second embodiment of the present invention. In comparison with the first embodiment, the n⁺ connection region 3a is formed deeper in this embodiment and this depth is greater than that of the p⁺ base region 4, with the remaining structure being the same as that of the first embodiment. The n⁺ connection region 3a is formed by implanting the P ions at an acceleration energy of 120 keV and in a dose of $8 \times 10^{11}$ cm² and diffusing them at 1,200° C. for 300 minutes. The depth at which the impurity concentration of this n⁺ connection region 3a is twice as that of the n⁻ drain region 2 is 5.0 μm and the peak concentration of the impurity is $1.5 \times 10^{15}$ cm³. Next, the boron ions are implanted at an acceleration energy of 70 keV and in a dose of $4 \times 10^{11}$ cm$^2$ and diffused at 1,200° C. for 60 minutes, thereby forming an n⁻ connection region 3b having an impurity concentration almost equal to that of the n⁻ drain region 2 and a depth of 0.5 μm.

This embodiment is more advantageous than the first embodiment that on-resistance is small.

Though the connection regions 3a and 3b having mutually different impurity concentrations are formed by ion implantation in the foregoing embodiments, they may be formed by epitaxial growth In such a case, in order to attain withstand voltage of more than 500 V, a 45 μm-thick, low concentration n⁻ conductivity type drain region 2 having a resistivity of 18 ohm-cm is first formed by epitaxial growth, then a high concentration n⁺ connection region 3a having specific resistance of 1 to 10 ohm-cm, for example is grown and thereafter an epitaxial layer having a specific resistance almost equal to that of the n⁻ conductivity type drain region 2 is formed on the n⁺ connection region 3a to form the n⁻ connection region 3b.

Referring to FIG. 9, the solid line 102 and the one-dot-chain line 103 represent the concentration distributions of the connection regions in the vertical direction A in FIGS. 5 and 8 in the first and second embodiments of the present invention, respectively. The impurity concentration near the surface is lower in the embodiments of the present invention than in the prior art examples and is substantially equal to that of the n⁻ drain region 2. On the other hand, in the portion deeper than a certain depth, the impurity concentration of the first embodiment is substantially equal to that of the prior art example and the impurity concentration of the second embodiment is rather higher. Therefore, the on-resistance is made smaller.

Figure 10:
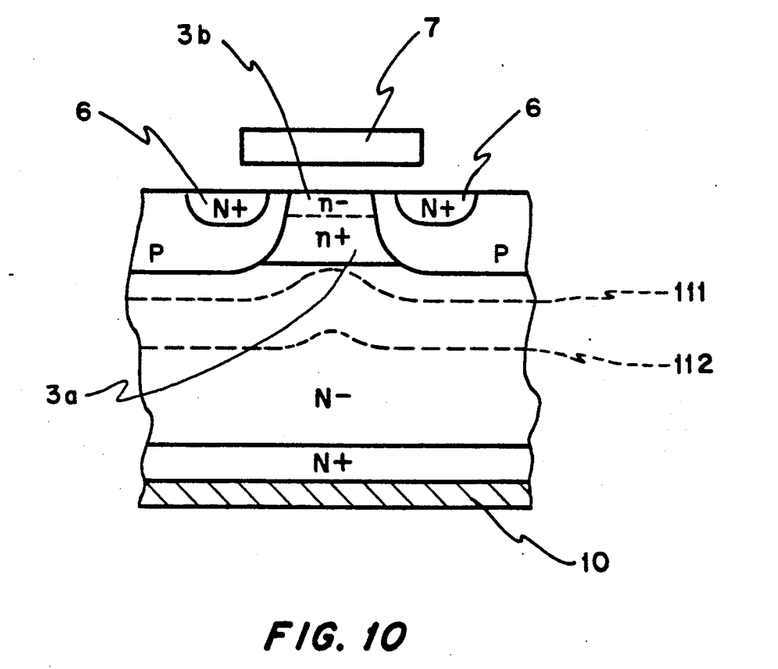
FIG. 10 is a schematic sectional view of a semiconductor chip showing the formation state of a depletion layer in the first embodiment of the present invention.

FIG. 10 is a schematic sectional view of a semiconductor chip and shows the formation state of the depletion layer in the first embodiment of the present invention. When the bias voltage is applied to the drain 10, the depletion layers 111, 112 are more likely to be extended than in the prior art example, the withstand voltage becomes higher and the parasitic capacitance becomes lower.

Figure 11:
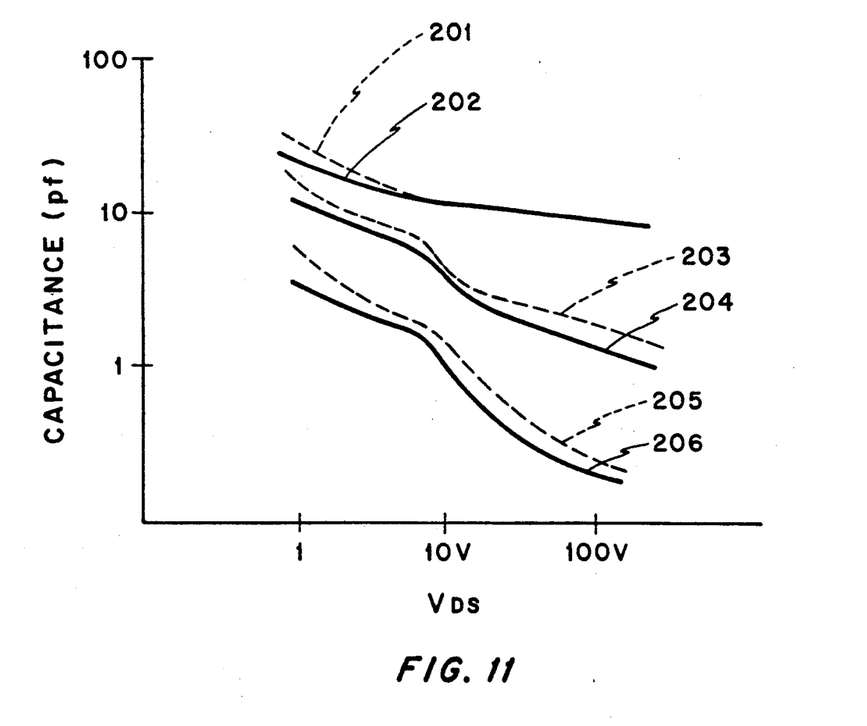
FIG. 11 is a diagram showing a drain voltage ($V_{DS}$) and an input capacitance, output capacitance and feedback capacitance in the conventional example and in the first and second embodiments of the present invention.

FIG. 11 is a diagram showing the relationship between the drain voltages (Vds) and input capacitance, output capacitance and feedback capacitance in the first and second embodiments of the present embodiments and in the prior art example having no n⁻ connection region 3b. A broken line 201 represents the input capacitance of the prior art, 202, the input capacitance of the present invention, 203, the output capacitance of the prior art, 204, the output capacitance of the present invention, 205, the feedback capacitance of the prior art and 206, the feedback capacitance of the present invention, respectively. Each of the input capacitance, output capacitance and feedback capacitance in the first and second embodiments of the present invention is smaller than that of the prior art example.

The impurity concentration of the n⁻ drain region 2 is favorably from $1 \times 10^{14}$ cm$^{-3}$ to $5 \times 10^{16}$ cm$^{-3}$, that is, the conductivity thereof is favorably from 100 ohm-cm to 0.4 ohm-cm. The conductivity of the n⁺ connection region 3a is favorably from 1.5 times to 3 times as large as that of the n⁻ drain region 2, the conductivity thereof being more favorably twice as large as that of the n⁻ drain region 2 The impurity concentration of the n⁻ connection region 3b is favorably from one half to twice as large as that of the n⁻ drain region 2, the impurity concentration thereof being more favorably from one half to the same as that of the n⁻ drain region 2. The depth of the n- connection region 3b is favorably from 0.1 μm to one half of that of the n⁺ connection region 3a.

Though the foregoing embodiments represent the case of the n-channel VMOSFET, the present invention can be likewise applied to the p-channel VMOSFETs.

I claim:

1. A semiconductor device comprising:
   a semiconductor layer of a first conductivity type;
   a plurality of base regions of a second conductivity type which is opposite to said first conductivity type, said plurality of base regions being formed in a main surface of said semiconductor layer;
   a plurality of source regions of said first conductivity type formed in said plurality of base regions;
   a plurality of gate electrodes formed above at least partial portions of said base regions with insulator films interposed between said gate electrodes and said base regions, said portions being positioning between said source regions and said semiconductor layer;
   a first semiconductor region of said first conductivity type having an impurity concentration which is higher than an impurity concentration of said semiconductor layer;
   a second semiconductor region of said first conductivity type having an impurity concentration which is lower than an impurity concentration of said first semiconductor region, said second semiconductor region being formed in said main surface of said first semiconductor layer between said plurality of base regions, said first semiconductor region being formed between said second semiconductor region and said semiconductor layer, and side walls of said first semiconductor region being in contact with said base regions;
   a source electrode connected electrically and commonly to said plurality of source regions; and
   a drain electrode electrically connected to a back surface of said semiconductor layer opposite to said main surface.

2. A semiconductor device as claimed in claim 1, wherein said gate electrodes are also formed above said second semiconductor region with said insulator films interposed between said gate electrodes and said second semiconductor regions.

3. A semiconductor device as claimed in claim 1, wherein said first semiconductor region is shallower than said base regions.

4. A semiconductor device as claimed in claim 1, wherein said first semiconductor region is deeper than said base regions.

5. A semiconductor device as claimed in claim 1, wherein said source regions and said base regions have an octagonal shape.

6. A semiconductor device as claimed in claim 1, wherein said second electrode is connected to said back surface of said semiconductor layer through another semiconductor layer having said first conductivity type and a higher impurity concentration than said semiconductor layer.

7. A semiconductor device as claimed in claim 2, wherein impurity concentration of said semiconductor layer is from $1 \times 10^{14}$ cm$^{-3}$ to $5 \times 10^{16}$ cm$^{-3}$, conductivity of said semiconductor layer being from 100 ohm-cm to 0.4 ohm-cm, conductivity of said first semiconductor region being from 1.5 times to 3 times as large as that of said semiconductor layer, and impurity concentration of said second semiconductor region being from one half to twice as large as that of said semiconductor layer.

8. A semiconductor device as claimed in claim 7, wherein conductivity of said first semiconductor region is twice as large as that of said semiconductor layer, impurity concentration of said second semiconductor region being from one half of to the same as that of said semiconductor layer.

9. A semiconductor device as claimed in claim 7, wherein depth of said second semiconductor region is greater than 0.1 μm and smaller than to one half of that of said first semiconductor region.

10. A vertical MOSFET comprising:
a drain region;
a plurality of base regions formed on a first surface of said drain region;
a plurality of source regions formed in said plurality of base regions, respectively;
a gate electrode formed above said first surface between said source regions with an insulator film interposed between said gate electrode and said first surface;
a first semiconductor region having an impurity concentration which is higher than an impurity concentration of said drain region and being the same conductivity type as that of said drain region;
a second semiconductor region formed in said first surface of said drain region between said base regions, said second semiconductor region having an impurity concentration which is lower than an impurity concentration of said first semiconductor region and being the same conductivity type as that of said drain region, said first semiconductor region being formed between said second semiconductor region and said drain region, and side walls of said first semiconductor region being in contact with said base regions;
a source electrode connected electrically and commonly to said plurality of source regions; and
a drain electrode connected electrically to a second surface of said drain region opposite to said first surface.

11. A vertical MOSFET as claimed in claim 10, wherein said source regions and said base regions have an octagonal shape.

12. A vertical MOSFET as claimed in claim 10, wherein impurity concentration of said drain region is from $1 \times 10^{14}$ cm$^{-3}$ to $5 \times 10^{16}$ cm$^{-3}$, conductivity of said drain region being from 100 ohm-cm to 0.4 ohm-cm, conductivity of said first semiconductor region being from 1.5 times to 3 times as large as that of said drain region, and impurity concentration of said second semiconductor region being from one half to twice as large as that of said drain region.

13. A vertical MOSFET as claimed in claim 12, wherein conductivity of said first semiconductor region is twice as large as that of said drain region, impurity concentration of said second semiconductor region being from one half of to the same as that of said drain region.

* * * * *